Aug. 21, 1956 C. W. WITTENBURG ET AL 2,760,060

ULTRA-HIGH FREQUENCY CONVERTER SYSTEM
HAVING CRYSTAL DIODE MIXER

Filed Dec. 11, 1952

INVENTOR.
CHARLES W. WITTENBURG
& GILBERT C. HERMELING JR.

BY H. L. Newton
ATTORNEY 2,760,060

ULTRA-HIGH FREQUENCY CONVERTER SYSTEM HAVING CRYSTAL DIODE MIXER

Charles W. Wittenburg, Collingswood, and Gilbert C. Hermeling, Jr., Camden, N. J., assignors to Radio Corporation of America, a corporation of Delaware Application December 11, 1952, Serial No. 325,314

4 Claims. (Cl. 250—20)

Figures 1, 2, 3:
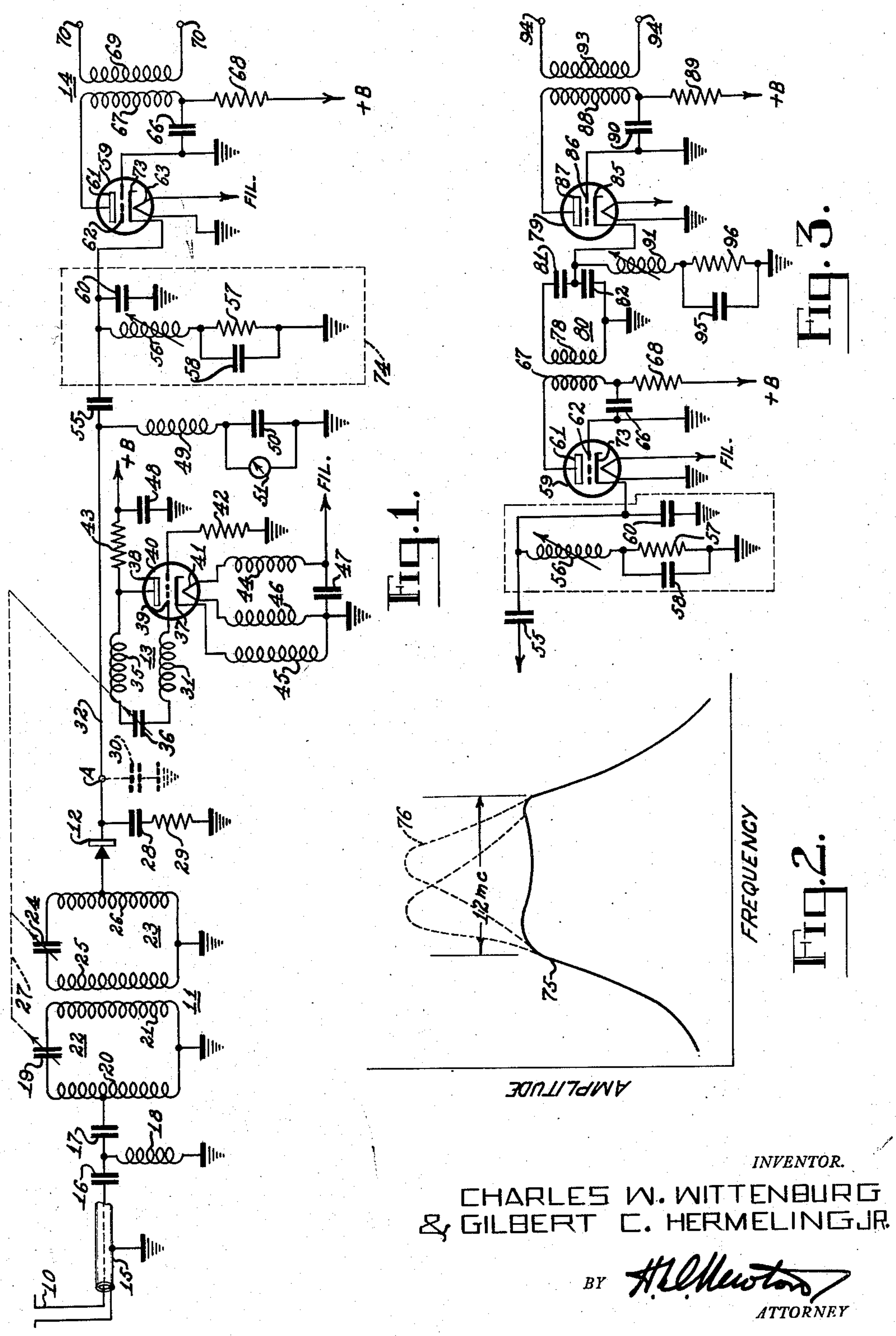

This invention relates to frequency converters for signal receiving systems and the like, and in particular to frequency conversion systems suitable for use in the ultra high frequency (U. H. F.) spectrum for the conversion of selected signals to a corresponding very high frequency (V. H. F.) signal.

A U. H. F. television frequency band has recently been allocated for the transmission of signals in the frequency range extending from 470 to 890 megacycles (mc.) wherein new television broadcast channels 14 to 83 have been established. This allocation permits one or more channels to be added to the available very high frequency (V. H. F.) television channels (2 to 13) in each broadcasting area or population center. While such an extension of television band facilities is a great advantage to the television public and television industry alike, a considerable number of technical problems must be solved before completely satisfactory signal reception is achieved at these higher frequencies.

To enable the average V. H. F. home-type television receiver to reproduce any of the transmitted signals of the U. H. F. band, a frequency converter must be provided to convert the U. H. F. signals to V. H. F. signals. One of the simplest forms of frequency converter for the U. H. F. band includes a mixer which may be a crystal rectifier and an oscillation generator. The input circuit for the mixer is usually selectively tunable over the desired band of received signals. The mixer output circuit is generally tuned to a fixed intermediate frequency. However, at higher operating frequencies it has been found that the mixer input and output circuits are prone to spurious detuning, resulting in unsatisfactory signal reception in some cases.

This detuning is caused in some instances by variations in the amplitude of the injected oscillatory wave energy which cause the mixer to express varying impedance characteristics. The crystals used for the mixer stage also often times exhibit frequency sensitive performance characteristics that vary considerably as the converter is tuned over a band of frequencies. These variations, which include impedance changes, also adversely affect the tuning of the mixer selective input and output circuits.

It has also been found that in those instances where the oscillator may be continuously varied over a band of frequencies, the frequency variations of the oscillator signal which is impressed on the mixer stage may cause mixer impedance changes and therefore mismatching between the impedance of the mixer and its input and output circuits, or detuning thereof. Detuning of the type described, in a converter circuit, may adversely affect the fidelity of the reproduced signal. It is desirable, therefore, that the detuning of the mixer input and output circuits of a frequency converter be substantially eliminated or minimized. It is also preferable that this result be attained without appreciably increasing the noise factor of the system.

It is, accordingly, a principal object of this invention to provide an improved frequency converter system for U. H. F. signal receiving systems and the like, wherein spurious mistuning of the frequency selective circuits may be minimized.

An additional object of the present invention is to provide an improved frequency converter system of the type employing a mixer and a local oscillator in which spurious mistuning of the converter stage as a function of oscillator frequency and signal amplitude change is minimized.

It is a further object of the present invention to provide an improved ultra-high-frequency to very-high-frequency signal converter especially adapted for use in translating television modulated radio frequency signals.

The conventional U. H. F. converter system may comprise in general a crystal mixer having a resonant input circuit which is tunable over the desired frequency band. The output electrode of the mixer is connected to a resonant circuit which is tuned to a predetermined intermediate frequency. A local oscillator is provided for injecting oscillatory energy between the output electrode of the mixer and the resonant output circuit. The intermediate frequency signals from the resonant output circuit are amplified by an intermediate frequency amplifying stage.

It has been found that the detuning of a converter system will be minimized and the band-pass characteristics of the mixer output circuits improved if the input impedance of the intermediate frequency amplifier stage is maintained at a low value. In accordance with the present invention, therefore, the intermediate frequency amplifying stage of the improved converter system comprises a single grounded-grid electron tube or, alternatively, two such tubes connected in cascade. The inductance of the mixer output lead and a series capacitor provide series resonance at the center of the intermediate frequency band. In addition, a parallel resonant circuit in the mixer output circuit provides parallel resonance at the center of the intermediate frequency band. By properly choosing the values of the circuit components which comprises the parallel resonant circuit, proper impedance matching may be attained.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1 is a circuit diagram of a U. H. F. converter embodying the present invention, Figure 2 is a graph relating the signal amplitude to the frequency of the circuit embodying the invention and of a U. H. F. converter wherein the impedance of the mixer varies over the tuning range; and Figure 3 is a circuit diagram illustrating a modification of the intermediate frequency amplifier stage of the circuit shown in Figure 1 in accordance with the present invention.

Referring now to the drawings, wherein like elements are designated by like reference numerals throughout the figures, and particularly to Figure 1, there is illustrated a U. H. F. converter comprising generally an antenna or signal collector 10, a selective signal receiving circuit 11, a crystal mixer 12, a local oscillator 13, and an intermediate frequency amplifier stage 14. The mixer 12 preferably consists of a crystal rectifier such as a germanium crystal rectifier of the commercially known CK–710 or 1N72 type. The crystal mixer 12 has two electrodes as illustrated; one being in ohmic contact and the other in rectifying contact with the crystal. It should be understood, however, that the position of the mixer electrodes in the circuit may be reversed without changing the function of the mixer.

The input circuit of the mixer 12 includes the antenna 10, which may be a dipole and which is connected to a transmission line 15 such as a coaxial line, having its outer conductor grounded. To filter the received signal two series capacitors 16 and 17 are connected between the transmission line 15 and the radio frequency input circuit 11, and an inductor 18 is connected between the junction point of capacitors 16 and 17 and a source of fixed potential or circuit ground for the converter. The combination of capacitors 16 and 17 and inductor 18 compise a high pass filter, which may, by way of example, reject signals having frequencies corresponding to channels 2 to 13.

To provide a tunable pass-band for U. H. F. signals, the radio frequency input circuit 11 includes two series-resonant tunable circuits 22 and 23 which are inductively coupled as indicated. Resoant circuit 22 includes an inductor 20 which has an intermediate point connected to the high pass filter circuit thereby matching the impedance of the filter to that of resonant circuit 23. The lower terminal of the inductor 20 may be grounded as is shown. The series resonant circuits 22 and 23 include capacitors 19 and 24 respectively, which may be ganged together and tuned in unison over the U. H. F. band as indicated by the dotted line connection 27. Resonant circuits 22 and 23 are inductively coupled through inductors 21 and 25 respectively. For impedance matching purposes an inductor 26 in the resonant circuit 23 has intermediate point connected to an electrode of the crystal mixer 12. The low potential terminals of inductors 25 and 26 are grounded.

The pair of series resonant circuits 22 and 23 illustrated in Figure 1 are of the type disclosed and claimed in a copending application of W. Y. Pan, Ser. No. 230,043, filed June 5, 1951, now Patent No. 2,702,373, and assigned to the same assignee as this application. It should be understood, however, that any other suitable structure may be used which provides a variable pass-band for a desired range of U. H. F. signals.

A shunt signal path, including capacitor 28 and resistor 29, is connected between the output electrode of crystal mixer 12 and ground. The impedance of this shunt path is small compared to the impedance of mixer 12 and determines the oscillatory energy impressed on the mixer 12 and maintains this energy substantially constant over the tuning range of the oscillator. This circuit is disclosed and claimed in a copending application of W. Y. Pan, Ser. No. 242,161, filed August 16, 1951, now Patent No. 2,653,228, and assigned to the same assignee as this application.

A capacitor 30, which is shown by dotted lines represents the equivalent capacity as it appears looking into the crystal mixer 12 from the point A. A lead or conductor 32 is provided between mixer 12 and a capacitor 55. The conductor 32 provides appreciable inductance in the circuit and is utilized for picking up signals from oscillation generator 13. The oscillation generator 13 may be of any type suitable for developing an oscillatory wave and as illustrated is of the type disclosed and claimed in a copending application of W. Y. Pan, Ser. No. 228,891, filed May 29, 1951, now Patent No. 2,717,313, and assigned to the same assignee as this application.

The oscillation generator 13 includes an electron tube 40, which for example, may be a triode. The cathode 37 of the tube 40 is grounded through an inductor 45. The control grid 39 is grounded through a suitable grid leak resistor 42 and the anode 38 is supplied with operating anode voltage as indicated at +B through a potential dropping resistor 43 which may be by-passed to ground at its input end, through by-pass capacitor 48. The filament or heater 41 is supplied with operating current through a circuit FIL and the R. F. inductors 44 and 46, the latter of which is connected to ground and the filament return circuit. The supply lead FIL is by-passed to ground through by-pass capacitor 47.

The frequency determining circuit for the oscillation generation 13 is series resonant and includes an inductor 35, a variable capacitor 36 and an inductor 31 connected in series between the anode 38 and the grid 39. The plate to grid capacity of the oscillator tube is also in series with the frequency determining elements of the circuit. The resonant frequency of this circuit is determined by varying the capacity of variable capacitor 36 which may be gang-connected with the tuning means of the selective circuits 22 and 23. The oscillation generator may be tuned through a predetermined band of U. H. F. frequencies in this manner.

The signal waves developed by the oscillation generator 13 are impressed on the conductor 32. This is made possible by disposing the oscillator 13 in close proximity to the conductor 32 so that the energy radiated by oscillator 13 from inductor 35, for example, is intercepted by the conductor 32. It should be understood however, that the oscillatory waves may be impressed on the output electrode of crystal mixer 12 in any other suitable manner which provides uniform signal transfer over a wide frequency range.

An inductor 49 is provided in series between the conductor 32 and a capacitor 50 and serves as a radio frequency choke for the oscillatory waves. The other end of the capacitor 50 is connected to ground, and a meter 51 which shunts capacitor 50 gives a visual indication of the direct current crystal excitation. The inductor 49 provides a return path for the direct current flowing through the mixer 12. Thus the direct current flows through conductor 32, inductor 49, meter 51, and ground thence back through inductor 26 and its tap and through crystal mixer 12.

As mentioned hereinbefore, it has been found that the transfor of signal energy from the mixer stage to the intermediate frequency stage of a converter system is accomplished with a minimum of misturning if the transfer is accomplished at low impedance values. In the embodiment of the invention illustrated in Figure 1, therefore, the intermediate frequency amplifier stage 14 of the U. H. F. to V. H. F. converted system comprises a single grounded-grid amplifying tube 59. To this end the output of the crystal mixer 12 is connected through blocking capacitor 55 to the cathode 73 of tube 59 thus providing the desired low input impedance. The combination of capacitor 55 and the inductance of conductor 32 provides a series resonant circuit, which may be resonant at the center of the intermediate frequency band for maximum power transfer. The amplifying tube 59 has an anode 61 which is connected through an inductor 67 and a potential dropping resistor 68 to a suitable source of anode voltage indicated at +B. To keep undesired radio frequency signals from affecting the anode supply voltage, a by-pass capacitor 66 is connected between one end of inductor 67 and the grid 62 which is grounded as shown. A source of heater or filament voltage indicate at FIL is connected to the filament 63, which is grounded at the opposite side.

The intermediate frequency signal is taken from the anode 61 of the amplifier tube 59. In a U. H. F. to V. H. F. converter this is the V. H. F. signal. To provide a desired impedance condition, a primary winding 67 of an output transformer is coupled between the anode 61 and ground through by-pass capacitor 66. The grid 62 is also grounded. A secondary winding 69 of the output transformer is provided with output terminal connections 70 which may be coupled to any utilization means such as a conventional V. H. F. receiver (not shown).

Further in accordance with the invention, a parallel resonant circuit indicated generally at 74 is connected at a point between the capacitor 55 and the cathode 73 of amplifier 59 to ground. The circuit 74 comprises an inductor 56 and a biasing resistor 57 connected in series between the coupling capacitor 55 and ground. Capacitor 58 is in parallel with the resistor 57 which provides grid bias for the amplifier 59. A capacitor 60 in the circuit 74 is connected between the amplifier cathode 73 to ground. The capacitor 60, in addition to any tube capacitance that may exist between the cathode 73 and ground and the inductor 56 together with the equivalent capacitor 30 looking into the mixer from the point A are chosen to be parallel resonant at the center of the I. F. band, thus permitting maximum power transfer. The ratio of the inductance of inductor 56 to the sum of the capacitances of capacitor 60 and equivalent capacitor 30 is chosen to give the best impedance match for the mixer 12 across the intermediate frequency band. Furthermore, the values of the circuit components comprising the mixer output frequency selective circuits may be chosen to have a low Q value. By way of example, capacitors 60 and 55 may have values of 15 micro-micro-farads and 56 micro-micro-farads respectively and inductor 56 a value between .12 and .18 microhenry, when using a crystal of the commercially known IN72 type. Since a low impedance input I. F. stage is used in conjunction with low Q selective circuits, impedance matching between the output circuit of the mixer and the input circuit of the I. F. stage may be realized at relatively low impedance values, and a uniform pass-band characteristic is achieved even with variations of mixer output impedance which are caused by constructional variations in crystals, crystal excitation, etc.

An approximation of the selectivity curve obtainable using the circuit as illustrated in Figure 1 is shown in Figure 2. The solid line 75 in Figure 2 represents the selectivity curve for the circuitry illustrated in Figure 1, and the dotted line 76 indicates the selectivity curve for a usual circuit wherein the mixer impedance changes are appreciable over the tuning range. By observing curve 75 it will become obvious that the band width of 12 mc., which is commonly used for the intermediate frequency of U. H. F. converters, will be uniform throughout the band to reproduce the incoming signal with high fidelity. The curve 76 on the other hand has a non-uniform characteristic over the intermediate frequency band width and the fidelity of the reproduced signal would be considerably poorer as compared to the reproduction when the circuit of the present invention is used.

If it is assumed for purposes of explaining the operation of the converter, that it is desired to receive channel 18 (494–500 mc.) the radio frequency input circuit may be tuned by ganged capacitors 19 and 24 to pass the band of frequencies between 494–500 mc. and reject all others. The local oscillator 13 may be tuned to produce an oscillatory wave having a frequency such that the difference of the oscillator and received frequencies when mixed in mixer 12 will produce an intermediate frequency having a band width of 12 mc. from 76–88 mc. The oscillatory wave, as previously explained, is inductively coupled to the conductor 32. Since the conductor 32 and capacitor 55 are chosen to be series resonant at the center of the intermediate frequency band, and the values of conductor 49 and capacitors 60 and 30 are chosen to be parallel resonant at this center frequency the intermediate frequency signals will be transferred to the grounded-grid amplifier 59 with maximum power. After amplification the intermediate frequency signals may be taken from the output terminals 70 and applied to a conventional V. H. F. receiver. Since the intermediate frequency band that is, the V. H. F. band, extends from 76–88 mc., either channel 5 or 6 of the conventional V. H. F. television receiver may be used for U. H. F. reception in the example chosen. It should be understood, however, that any of the other V. H. F. channels may be used equally well if the frequency determining circuits of the system are adjusted to produce the appropriate intermediate frequency (or V. H. F.) signal. In this manner a V. H. F. receiver may be adapted without change to receive any of the U. H. F. signals. The converter shown and described is relatively inexpensive and has excellent performance characteristics. The conversion system provided therein exhibits a minimum of mistuning, a relatively constant band pass characteristic, and an overall gain of about unity.

If it is desired to increase the gain of the intermediate frequency or V. H. F. amplifier stage while at the same time maintaining a relatively low load impedance, two grounded grid amplifiers may be connected in cascade as shown in the embodiment of the invention illustrated in Fig. 3. In Fig. 3 only the intermediate frequency amplifying stage and its input circuit is illustrated, the oscillator and mixer circuits being eliminated for reasons of clarity. The first amplifier tube 59 and its associated circuitry may be identical with the circuitry for the amplifier of Fig. 1. Thus, for example, a blocking capacitor 55 is connected in series with the cathode 59 and parallel resonant circuit 74 is connected from a point between the capacitor 55 and cathode 59 to the ground.

The parallel resonant circuit 74 performs the identical function of the resonant circuit illustrated in Fig. 1. The anode 61 is connected through an inductor 67 and dropping resistor 68 to a suitable source of anode voltage indicated generally as +B. The control grid 62 of tube 59 is grounded and a by-pass capacitor is connected between inductor 67 and resistor 68 to ground, thus providing a by-pass path for unwanted radio frequencies.

To provide a desired impedance condition, the inductor 67 is coupled inductively to a further inductor 78 in the tuned input circuit 80 of an additional amplifier tube 79. Capacitors 81 and 82 are serially connected to the inductor 78 in the input circuit 80 and may provide a capacitor tap-down for additional impedance matching. The cathode 85 is connected to a point intermediate the capacitors 81 and 82, and control grid 86 is grounded similar to the control grid 62 of amplifier 59. The anode 87 of the tube 79 is connected through inductor 88 and potential dropping resistor 89 to a suitable source of anode voltage indicated at +B.

To by-pass unwanted radio frequency signals to ground, a capacitor 90 is connected from the grid 86 to a point intermediate the conductor 88 and resistor 89. The converter output may be taken across terminals 94 which are connected to an inductor 93 which in turn is magnetically coupled to the anode inductor 88.

Thus the circuit as illustrated in Fig. 3 may achieve increased gain while maintaining a relatively low load impedance and a frequency selectivity characteristic which is comparable to that illustrated by the curve 75 in Fig. 2. It has been found that the noise figure of two amplifiers connected in cascade relationship is not appreciably increased and the overall performance characteristics are quite favorable when compared to a driven-grounded-grid stage of I. F. amplification.

What is claimed is:

1. A frequency converter for signals in an ultra high frequency band, comprising a crystal mixer having two electrodes, a resonant signal input circuit connected to one of said electrodes and tunable over a predetermined band of frequencies to select received modulated carrier waves, means providing a series-resonant signal output path including an inductive lead and a capacitor connected to the other of said electrodes, an oscillation generator tunable within the ultra high frequency band, means coupling said oscillation generator to said inductive lead to impress an oscillatory wave thereon, an intermediate frequency amplifier stage including an electronic amplifier device having at least an anode, a cathode, and a control grid, means for maintaining said control grid at reference potential, means coupling the said series resonant signal output path to said cathode, a parallel resonant circuit connected between said cathode and said point of reference potential, and means providing a predetermined ratio of inductance to capacitance of said parallel resonant circuit to provide optimum impedance match for said crystal mixer.

2. A variably tunable frequency converter for signals in an ultra high frequency range, comprising a crystal mixer having two electrodes, a resonant signal input circuit connected to one of said electrodes and tunable over a predetermined portion of said frequency range to select modulated carrier waves, a conductor providing a predetermined circuit inductance connected to the other of said electrodes and to a capacitor, said conductor and said capacitor providing a series resonant circuit, an oscillation generator tunable within another portion of said frequency range, means coupling said oscillation generator to said conductor to impress an oscillatory wave thereon, an intermediate frequency amplifier stage including an amplifier device having at least an anode, a cathode, and a control grid, means for maintaining said control grid at ground potential for the system, means coupling said series resonant circuit to the cathode of said amplifier device, an output circuit including tunable inductor and capacitor means parallel-resonant to an intermediate frequency and connected between said series resonant circuit and said amplifier cathode and to a point of fixed potential, whereby a low impedance load is provided for said mixer, and means providing a predetermined ratio of inductance to capacitance of said parallel resonant circuit to provide optimum impedance match for said crystal mixer.

3. A variably tunable frequency converter for signals in an ultra high frequency band comprising a crystal mixer having a first and a second electrode, a resonant signal input circuit connected to the first electrode and tunable over a predetermined portion of said frequency band to select modulated carrier waves, a mixer output conductor providing predetermined circuit inductance connected to the second of said electrodes and to a first capacitor, an oscillation generator tunable within another portion of said frequency range, means providing a low signal impedance path including a resistor and a capacitor connected in series between said second electrode and a point of fixed potential, means coupling said oscillation generator to said conductor to impress an oscillatory wave thereon, an intermediate frequency amplifier tuned to a predetermined intermediate frequency band and including an amplifier tube having at least an anode, a cathode, and a control grid, means for maintaining said control grid at ground potential, means coupling said first capacitor to said cathode, said first capacitor and mixer output conductor being series resonant at the center of the intermediate frequency band, a circuit parallel resonant at the center of the intermediate frequency band connected between said first capacitor and said cathode and to said point of fixed potential, and means providing a predetermined ratio of the capacitance to the inductance of said parallel resonant circuit for providing impedance match between said mixer and said amplifier.

4. A tunable frequency converter for converting signals in an ultra high frequency band to corresponding very high frequency signals comprising a crystal signal mixer having two electrodes, a resonant signal input circuit including a band pass filter connected to one of said electrodes and tunable over a predetermined portion of said frequency band to select modulated carrier waves, a first coupling capacitor, a conductor providing predetermined circuit inductance connected serially between the other of said electrodes and said capacitor, said conductor and said capacitor being series resonant at a predetermined very high frequency, an oscillation generator tunable within another portion of said frequency band and coupled with said conductor to impress an oscillatory wave thereon, electron tube means for amplifying signals at said very high frequency having an anode, a cathode, and a control grid, means for maintaining said control grid at ground potential for said converter, means coupling said first capacitor to said cathode, an inductor connected in series between said first capacitor and said circuit ground, a further capacitor connected between said circuit ground and a point intermediate said first capacitor and said cathode, the combination of said inductor, said further capacitor, and an equivalent output capacity of said mixer providing a circuit parallel resonant at said very high frequency, means providing a predetermined ratio of the capacitance to the inductance of said parallel resonant circuit for providing impedance match between said mixer and said amplifier, means providing very high frequency output terminals for said converter, and means coupling the anode with said terminals.

References Cited in the file of this patent

UNITED STATES PATENTS

| | | |
|---|---|---|
| 1,888,430 | Miller | Nov. 22, 1932 |
| 2,524,821 | Montgomery | Oct. 10, 1950 |
| 2,640,919 | Bell | June 2, 1953 |
| 2,653,228 | Pan | Sept. 22, 1953 |
| 2,712,062 | Frantz | June 28, 1955 |